United States Patent [19]

Krempl et al.

[11] Patent Number: 4,667,127
[45] Date of Patent: May 19, 1987

[54] PIEZOELECTRIC SENSOR ELEMENT WITH AT LEAST TWO SINGLE CRYSTAL ELEMENTS

[75] Inventors: Peter W. Krempl, Graz; Johann Stubenberg, Dorf Gleichenberg; Alfred Enko, Graz, all of Austria

[73] Assignee: AVL Gesellschaft fur Verbrennungskraftmaschinen und Messtechnik mbH, Prof. Dr.Dr.h.c. Hans List, Graz, Austria

[21] Appl. No.: 873,158

[22] Filed: Jun. 10, 1986

Related U.S. Application Data

[63] Continuation of Ser. No. 682,180, Dec. 17, 1984, abandoned.

[30] Foreign Application Priority Data

Dec. 28, 1983 [AT] Austria .................................. 4555/83

[51] Int. Cl.⁴ ........................................... H01L 41/08
[52] U.S. Cl. .................................... 310/338; 310/329; 310/365; 310/369
[58] Field of Search ............... 310/328, 338, 365, 366, 310/369, 329

[56] References Cited

U.S. PATENT DOCUMENTS

| | | | |
|---|---|---|---|
| 2,988,728 | 6/1961 | Marlow | 310/338 X |
| 3,281,612 | 10/1966 | Hatschek | 310/338 |
| 3,281,613 | 10/1966 | Hatschek | 310/338 |
| 3,349,259 | 10/1967 | Kistler | 310/338 |
| 3,521,090 | 7/1970 | Angeloff | 310/366 |
| 4,523,121 | 6/1985 | Takahashi et al. | 310/338 X |

FOREIGN PATENT DOCUMENTS

| | | |
|---|---|---|
| 237928 | 1/1965 | Austria . |
| 237930 | 1/1965 | Austria . |
| 271947 | 6/1969 | Austria . |
| 278402 | 1/1970 | Austria . |

*Primary Examiner*—Mark O. Budd
*Attorney, Agent, or Firm*—Watson, Cole, Grindle & Watson

[57] ABSTRACT

Individual single crystal elements stacked one above the other are aligned with their optical (Z) axes parallel to each other, and are provided with contact electrodes on opposite surfaces normal to their electrical (X) axes. Contact electrodes of the same polarity are conductively connected by two bridge electrodes that are applied to opposite sides of the assembled stack of individual crystal elements in the form of a conductive coating, and are provided with a lead leaving the sensor element. Contact electrodes of the opposite polarity are recessed in the vicinity of the bridge electrode serve the other polarity.

2 Claims, 9 Drawing Figures

Fig. 7
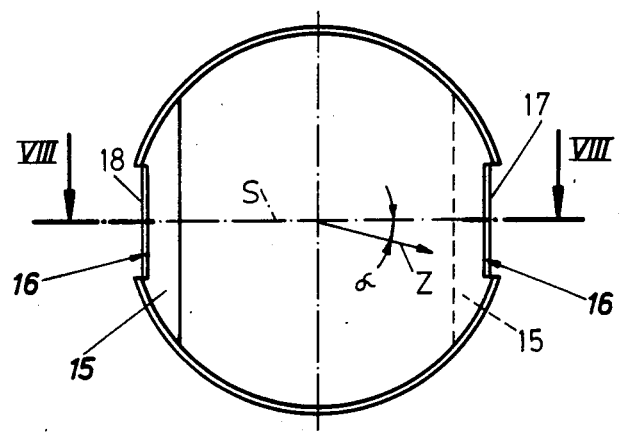
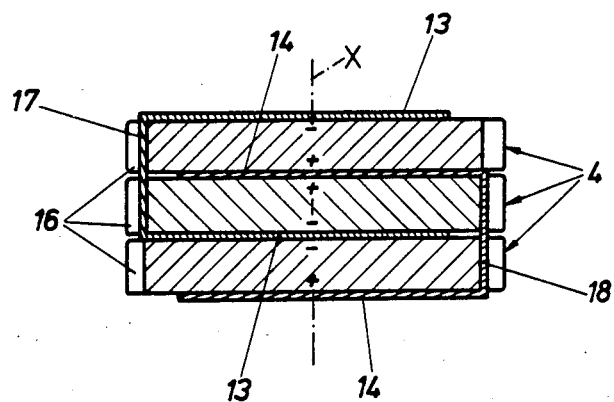
Fig. 8

PIEZOELECTRIC SENSOR ELEMENT WITH AT LEAST TWO SINGLE CRYSTAL ELEMENTS

This application is a continuation of application Ser. No. 682,180, filed Dec. 17, 1984, now abandoned.

BACKGROUND OF THE INVENTION

The present invention relates to a piezoelectirc sensor element, especially a piezoelectric sensor element designed for use in transducers for the measurement of mechanical variables by utilizing the longitudinal piezoelectric effect, comprising two or more disc-shaped single crystal elements which are stacked one above the other such that their optical (Z) axes are parallel to one another and that the variable to be measured may act on all of them in the same way, and which are furthermore provided with contact electrodes on opposite surfaces normal to their electrical (X) axes. The electrodes of the same polarity of the individual single crystal elements are in pairs at least in partial contact, and the stack has connecting leads for electrodes of the same polarity in whose vicinity the contiguous electrodes of two adjacent single crystal elements are recessed. The connected electrodes of the same polarity are each provided with a signal lead leaving the sensor element.

DESCRIPTION OF THE PRIOR ART

Monocrystallic piezoelectric sensor elements are, for example, described in Austrian Pat. Nos. 237,928 and 237,930, both designs utilizing the longitudinal piezo effect. These sensor elements comprise three or more discs placed one above the other, thus forming a stack, preferably consisting of quartz crystals, between which electrodes are provided for the pick-up of electrical charge, electrodes of the same polarity being connected.

In this context methods of manufacture are known by which the single crystal platelets are bonded by welding, soldering or sintering to form an integrated stack, utilizing the intermediate metal layers. As the longitudinal piezo effect is being used, the normal vector of these platelets is parallel to the electrical axis of the single crystal.

DESCRIPTION OF THE DRAWINGS

The basic crystallographic details required for an understanding of the present invention are best illustrated by the drawings accompanying this description which will be discussed in detail below.

FIG. 3a shows a perspective view of a sensor element according to the present invention.

FIGS. 4 and 7 show views from above of single crystal elements for use in a sensor element according to the invention, and FIGS. 5, 6 and 8 present the respective views, as indicated in FIGS. 4 and 7.

DESCRIPTION OF THE PREFERRED EMBODIMENTS

Figure 1:
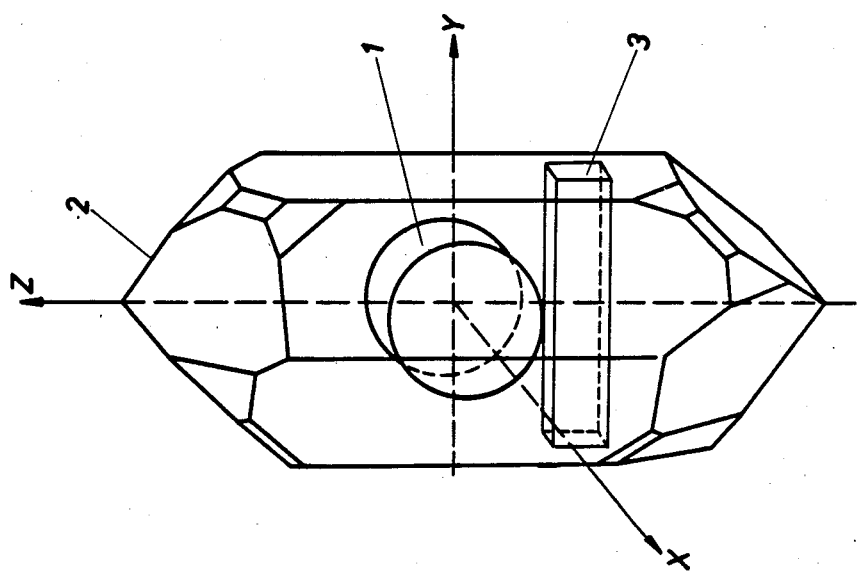
FIG. 1 gives the position of the crystallographic X,Y,Z axes relative to two given single crystal elements, a quartz being used in this example.

The cutting of the individual single crystal elements 1 from the original crystal 2 (a quartz in this figure) may be pictured as shown in FIG. 1. In this instance, force is applied parallel to the X-axis, and the piezoelectric sensitivity is described by the piezo modulus $d_{11}$. Since force is applied in a direction normal to the plane defined by the Y and Y-axes, orientation of the Z-axis is of no consequence in the transducer.

A completely different situation prevails in transducers utilizing the transversal piezoelectric effect. In FIG. 1 a crystal bar 3 is shown representing a sensor element for a transducer utilizing the transversal piezo effect. As in the crystal platelet 1, the surfaces of the crystal parallel to the Z-Y plane have a conductive coating for picking up the charge. As with the longitudinal effect, electrical polarization takes place parallel to the X-axis. The main difference is in the direction in which force is applied which is parallel to the Y-axis when the transversal piezo effect is utilized. Since the application of force in a direction parallel to the Z-axis will cause no dielectric displacement and the crystal will therefore be insensitive to forces acting parallel to the optical axis, force should be applied parallel to the Y-axis of the crystal when the transversal piezo effect is utilized. If several crystal bars are used in a transducer utilizing the transversal piezo effect, orientation of the Y-axis is of the utmost importance for the above reasons.

As there are forces normal to the Y-axis even in piezoelectric transducers utilizing the longitudinal piezo effect and incorporating platelets of type 1, it was proposed in the above-mentioned Austrian Pat. No. 237,928 that piezoelectric sensor element comprising n single crystal platelets (n≧3) be designed such that the Y-axis be rotated from platelet to platelet by an angle preferably amounting to 360°/n, causing the Y-axis of the entire element to form a helical surface rotating through 360° from the first to the last platelet. This should help to achieve uniform transversal sensitivity of the piezo element, i.e., its piezoelectric sensitivity relative to forces normal to the X-axis should be the same in all directions.

As in a piezoelectric transducer based on the longitudinal piezo effect, all forces normal to the X-axis must be regarded as interferences, and as these forces—as far as they are external—may be more effectively eliminated by an appropriate design of the sensor housing, uniform sensitivity of the piezo module with regard to forces acting in a direction normal to the X-axis and affecting the values measured, is rather a disadvantage. For instance, if four single crystal elements are used between which the angle of rotation from one element to the other is precisely 90°, as specified in the known variant, any heating of the element designed as above will result in considerable transversal stresses which will occur at the interface between two platelets and are caused by the different coefficients of expansion of the crystal platelets in the Y and Z directions, and which will affect the measurement results, acting as quasi-internal stresses of the piezo module. Similarly, differing transversal contraction coefficients will generate non-linear shear stresses when a force or pressure is applied, thus leading to non-linearity of the measurement signal.

Other sensor elements of the above type are known, e.g., from Austrian Pat. No. 272,947 in which the disc-shaped single crystal elements are arranged such that their optical (Z) axes are parallel to each other. In this way the coefficients of expansion of the individual discs are identical in all directions, and stresses at the interfaces between the individual discs are avoided. In this known kind of construction, charge is picked up by providing the electrodes of each side of the individual discs with extensions which extend through bores in the single crystal as far as the respective opposite surface where they are bent, fitting into a recess of the corresponding electrode, with a gap for the necessary insulation. By means of markers or similar measures the bent connecting extensions of two adjacent single crystal elements may be aligned one above the other, the crystal elements in the sensor element being connected in parallel as a result.

Another variant is known from Austrian Pat. No. 278,402, with a similar arrangement and alignment of the individual singel crystal elements and also a similar type of connecting leads.

One of the main disadvantages of these known arrangements is that part of the charge that may be picked up from the individual single crystal elements is inevitably lost. On the one hand the charge originating on the insulating zone between the bent extension of the connecting lead and the recess cut into the surrounding electrode cannot be carried off, and on the other hand the charge originating beneath the bent extension on the opposite crystal surface will counteract the charge of the contact surface of the extension by its inverse polarity, which in total will result in a loss of charge more than twice as large as that corresponding to the actual area of the contact zone. Especially in miniature single crystal elements which still must have certain insulating and contact zones of the individual connecting leads, these losses of charge will be felt increasingly, leading to sensitivity losses of up to 25%, for instance, in single crystal elements of a diameter of approximately 3 mm, which are used, e.g., in pressure transducers that may be inserted into indicator bores of internal combustion engines. Besides, this type of sensor element is susceptible to leak currents in the insulating zone, which will influence the measurement values in an undesirable manner.

SUMMARY OF THE INVENTION

It is an object of the present invention to provide a piezoelectric sensor element of the above type which is characterized by reduced susceptibility to interferences resulting from thermal or mechanical loads, as compared to conventional sensor elements, and by a minimum of charge losses due to the particular arrangement of electrodes required for charge pick-up, which will give optimum sensitivity even in miniature sensor elements.

According to the invention this is achieved by connecting the contact electrodes placed on the distant faces of adjacent crystal elements by bridge electrodes along the stack side wall in the area of the recesses of contact electrodes, and by forming the bridge electrodes along the side of the assembled stack by applying a conductive coating.

Recesses of contact electrodes with different polarity are located at opposite sides of the stack, so that electrodes of the same polarity are connected by one of the two bridge electrodes on opposite sides of the stack. The optical Z-axes of the crystal elements, which are parallel to each other, form angles of less than or equal to 40° with a plane which contains the center of each of the two bridge electrodes and the central axes of the disc-shaped single crystal elements, which are parallel to the electrical X-axes. This will prevent the measurement signal from being influenced by piezo signals that may be caused by transversal piezo effects during the acting of forces normal to the X-axis.

The noted configuration of the bridge electrodes between the individual single crystal elements will greatly simplify the manufacturing of such a sensor element, making it suitable for large-scale production, e.g., by photolitography.

In this development the above disadvantages of the known arrangements will be eliminated, one basic idea being that arranging the single crystal elements with their optical (Z) axes parallel to each other will prevent shearing movements at the interfaces between the individual single crystal elements, which will permit contacting the electrodes from the side wall of the stack in a simple way, preferably by bridge electrodes that are applied by vacuum evaporation, cathodic sputtering, or similar methods. The improved stability against the formation of Dauphiné twins resulting from aligning the individual single crystal elements as described above, is of particular advantage in this context. A Dauphiné twin is an area of the single crystal in which the X-axis is rotated by 180° around the Z-axis relative to the X-axis of the rest of the crystal. Formation of such Dauphiné twins will result in a sudden loss of sensitivity of the piezo element since the charges generated in these areas by the variable to be measured are of opposite polarity to those outside of these areas.

If F denotes the surface of the crystal from which charge is picked up as a measurement signal, e.g., by a conductive coating, and $F_z$ that part of the surface formed by twinning, the resulting charge is given by $$Q = d_{11}(1 - 2\, F_z/F) \cdot k,$$

k denoting the normal component of the force acting on the surface. It is to be noted that twinning of 50% will reduce the sensitivity Q/k to zero. Such twins will occur, for instance, in quartz and berlinite ($AlPO_4$), above all at temperatures greater than 200° C. Twinning is enhanced by the occurence of shear stresses. Aligning the optical (Z) axes as described above will help to avoid such shear stresses, raising the temperature limits for twinning in quartz by 50° C. at most, pressure being kept constant.

The single crystal elements used in this context may be selected from the crystallographic point group 32 ($D_3$), for example, as these elements are easy to produce in addition to having excellent temperature characteristics, retaining their piezoelectric properties even in temperature ranges far beyond those of quartz or berlinite.

Figure 2:
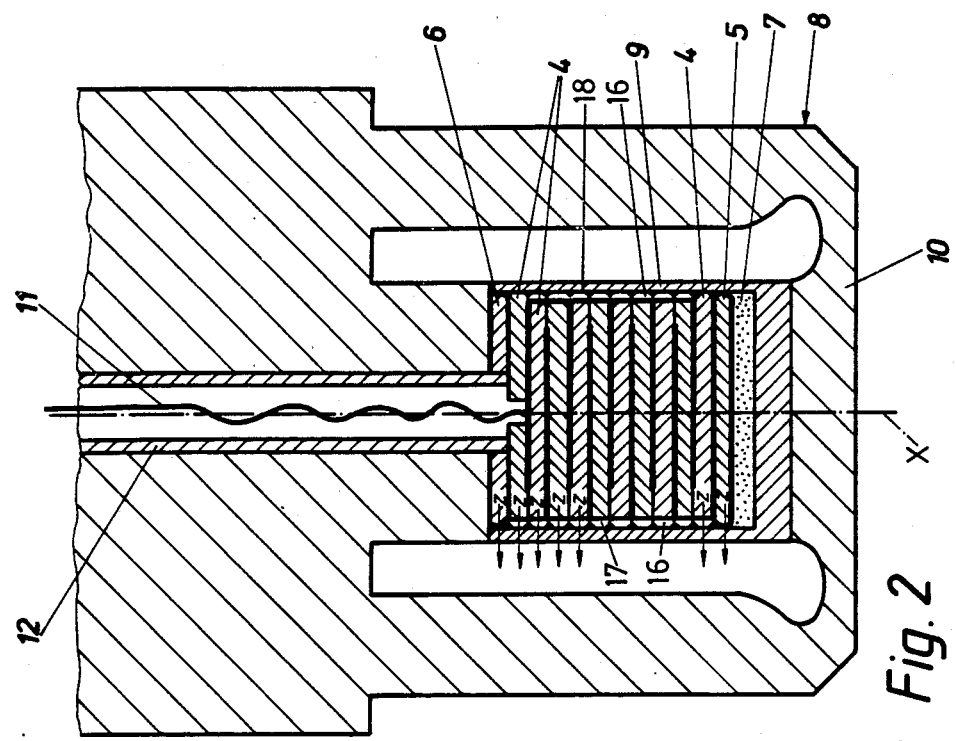
FIGS. 2 and 3, show how the individual crystal elements are contacted and arranged in a sensor element according to the present invention and how the measurement signals of such an element are picked up in a transducer.

FIG. 2 shows a section through a transducer designed as a pressure sensor with several single crystal elements 4, stacked one above the other, such that their central axes are parallel to their electrical axes. The pressure sensor contains other crystal elements 5, 6 as boundary elements in addition to the crystal elements 4 which serve as measuring crystals proper, and has two bridge electrodes 17,18 applied at the bottom of grooves 16 along opposite sides of the crystal elements. The Z-axes of these boundary crystals also are parallel to the Z-axes of the measuring crystals 4, the opposing electrodes of the crystal elements 5, 6 being connected with each other, however, such that the crystals are short-circuited and do not contribute to the piezoelectric signal. In a single-lead transducer the electrodes of these single crystal elements 5,6 are preferably connected to a housing ground. The sensor element comprising single crystal elements 4 to 6 is placed in a pre-loading sleeve 9 together with a compensation disc 7 in this variant, which sleeve 9 is connected to the housing 8 of the transducer in a manner not shown, and on whose side facing the measurement medium the pressure to be measured may be applied via a membrane 10. The measurement signals are picked up from the sensor element, or rather from the individual electrodes of the single crystal elements by a lead 11 on the one hand and by housing ground on the other. Also shown is an insulating sleeve 12 inserted into the housing of the transducer, whereas the other details have not been included in this drawing.

Figure 3:
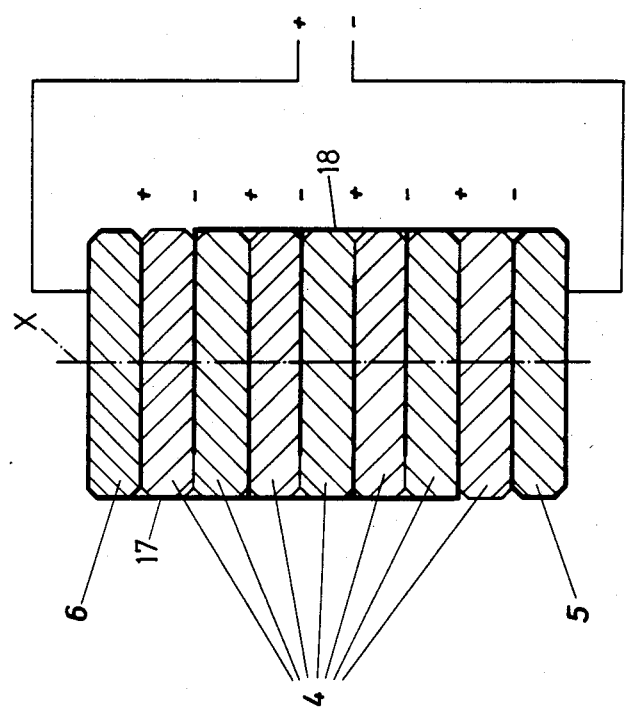

FIG. 3 presents a diagram of the electrical connections of a transducer designed according to the invention. Short-circuiting the boundary elements 5, 6 will compensate the differences in expansion coefficients and in mechanical transverse contractions between the single crystal elements and the adjacent housing which is not shown here.

FIG. 3a presents a perspective view of a sensor element comprising two disc-shaped single crystal elements 4. Opposite sides of each single crystal element are provided with contact electrodes 13,14 (see also FIGS. 7 and 8) normal to the electrical X-axis. Each of these contact electrodes has a recess 15 at a part of the circumference of the crystal element. The recesses 15 of contact electrodes with different polarity are located at opposite sides of the stack, formed by the single crystal elements 4. Electrodes of the same polarity are conductively connected by two bridge electrodes 17,18 in the areas of the recesses 15. In the shown embodiment the bridge electrodes 17,18 are applied at the bottom of grooves 16 located in opposite sides of the stack. The optical Z-axes of the crystal elements 4, which are parallel to each other, form angles $\alpha \leq 40°$ C., preferably 0°, with a plane S which contains the center C of each of the two bridge electrodes 17,18 and the central axes of the disc-shaped single crystal elements, which are parallel to the electrical X-axis.

Figure 4:
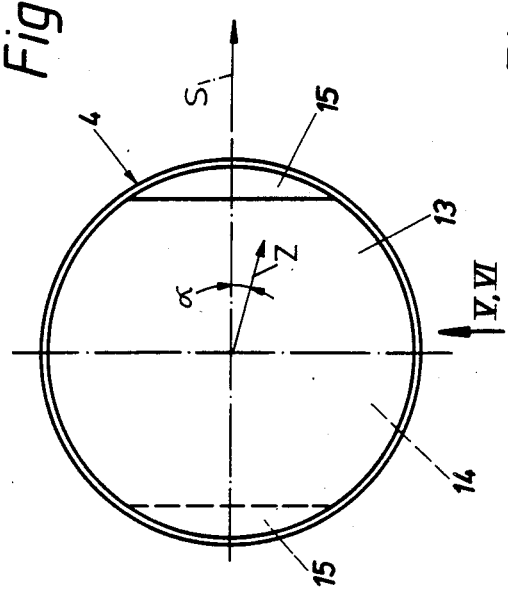
Figure 5:
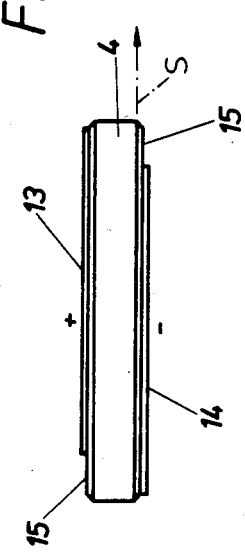

FIGS. 4 and 5 present a single crystal element 4 whose opposite faces are provided with the electrodes 13, 14 for the positive and negative charges, before cutting grooves in the areas of the recesses 15. The recesses 15 are located in the direction of the optical (Z) axis of the single crystal elements 4, which optical (Z) axis forms an angle $\alpha < 40°$ with the plane S.

According to FIGS 3a, 7 and 8, a sensor element is produced by first bonding the single crystal elements 4, for instance, by cold pressure-welding, ultrasonic welding, soldering, adhesive bonding or conventional welding techniques. After bonding of the crystal elements 4, grooves 16 are cut into the sides of the stack at whose bottom the bridge electrodes 17, 18 are applied which connect the contact electrodes 13, 14 of the single crystal elements 4. Due to the electrode-free zones (recesses 15) an insulating zone is provided in the area of the groove against the bridge electrodes of the opposite polarity. The loss area and thus the loss of charge in a platelet of 3 mm diameter, may be reduced to approximately 2.5% in this manner.

Figure 6:
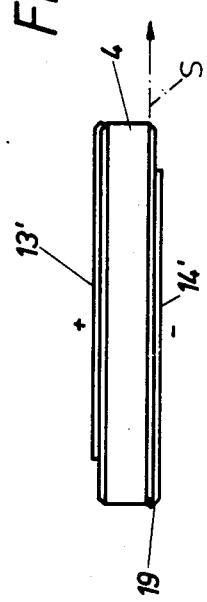

It will also be possible to interconnect the individual single crystal elements without cutting a groove into the stack of crystals, however. This may be achieved, for instance, by using a single crystal element 4 as shown in FIG. 6, whose electrodes 13', 14' have contacts extending beyond a bezel 19, which may be contacted directly by a bridge electrode applied to the side wall of the element.

We claim:

1. A piezoelectric sensor element comprising at least two disc-shaped single crystal elements having optical (Z) axes and electrical (X) axes, said single crystal elements being stacked one above the other such that said optical (Z) axes thereof are parallel to one another and that a variable to be measured acts in the same way on all of said crystals, said single crystal elements being provided with contact electrodes on opposite surfaces normal to said electrical (X) axes, said contact electrodes of said individual single crystal elements being at least partly in contact with electrodes of the same polarity of an adjacent crystal element, each contact electrode having a recess at a part of the circumference of said crystal element, said recesses of said contact electrodes with different polarity being located at directly opposite sides of the stack formed by said single crystal elements, said electrodes of the same polarity being conductively connected by two bridge electrodes along said opposite side of said stack, said bridge electrodes being formed by applying a conductive coating in the vicinity of said recesses of the electrodes of the opposite polarity, wherein said optical (Z) axes of said crystal elements form angles $\alpha \leq 40°$ with a plane (S) which contains the center (C) of each of said bridge electrodes and the central axes of said disc-shaped single crystal elements, which are parallel to said electrical axis (X) of said stack, and further said connected contact electrodes of the same polarity being provided with leads leaving the sensor element.

2. A sensor element as in claim 1, wherein said stack of single crystal elements is provided with grooves cut into said side walls thereof, and wherein said bridge electrodes are applied at the bottom of said grooves.

* * * * *

UNITED STATES PATENT AND TRADEMARK OFFICE
CERTIFICATE OF CORRECTION

PATENT NO.  : 4,667,127

DATED       : May 19, 1987

INVENTOR(S) : Peter W. Krempl et al.

It is certified that error appears in the above-identified patent and that said Letters Patent is hereby corrected as shown below:

In column 2, line 10, replace "Y-axes" with --Z axes--; replace "Z-axis" with --Y-axis--.

Signed and Sealed this

Thirteenth Day of October, 1987

Attest:

DONALD J. QUIGG

Attesting Officer

Commissioner of Patents and Trademarks